United States Patent
Wang et al.

(10) Patent No.: US 8,996,083 B2
(45) Date of Patent: Mar. 31, 2015

(54) SELF-SHIELD OPEN MAGNETIC RESONANCE IMAGING SUPERCONDUCTING MAGNET

(75) Inventors: Qiuliang Wang, Beijing (CN); Xinning Hu, Beijing (CN); Chunzhong Wang, Beijing (CN); Hui Wang, Beijing (CN); Luguang Yan, Beijing (CN); Yinming Dai, Beijing (CN); Baozhi Zhao, Beijing (CN); Jianhua Wang, Beijing (CN); Jianyi Xu, Beijing (CN)

(73) Assignee: Institute of Electrical Engineering, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/125,003
(22) PCT Filed: Dec. 14, 2011
(86) PCT No.: PCT/CN2011/083970
§ 371 (c)(1), (2), (4) Date: Dec. 9, 2013
(87) PCT Pub. No.: WO2012/171309
PCT Pub. Date: Dec. 20, 2012

(65) Prior Publication Data
US 2014/0121114 A1    May 1, 2014

(30) Foreign Application Priority Data
Jun. 14, 2011   (CN) .......................... 2011 1 0158077

(51) Int. Cl.
| | | |
|---|---|---|
| *G01R 33/035* | (2006.01) | |
| *G01R 33/34* | (2006.01) | |
| *G01R 33/38* | (2006.01) | |
| *G01R 33/3815* | (2006.01) | |
| *H01F 6/06* | (2006.01) | |
| *G01R 33/421* | (2006.01) | |

(52) U.S. Cl.
CPC ...... *G01R 33/34023* (2013.01); *G01R 33/3806* (2013.01); *G01R 33/3815* (2013.01); *H01F 6/06* (2013.01); *G01R 33/421* (2013.01)
USPC ........................................................ 505/162

(58) Field of Classification Search
CPC .............. H01L 39/225; H01L 39/2496; G01R 33/0538; G01R 33/0352
USPC ......................................... 505/162; 324/318
See application file for complete search history.

(56) References Cited

U.S. PATENT DOCUMENTS

| | | | | |
|---|---|---|---|---|
| 5,677,660 A | * | 10/1997 | Ariyoshi | ........................ 335/301 |
| 8,204,563 B2 | * | 6/2012 | Wang et al. | ................... 505/211 |
| 2011/0082043 A1 | | 4/2011 | Wang et al. | |

FOREIGN PATENT DOCUMENTS

| | | |
|---|---|---|
| CN | 101552077 A | 10/2009 |
| JP | 2005109144 A | 4/2005 |
| JP | 2007282859 A | 11/2007 |

OTHER PUBLICATIONS

International Search Report for International Application No. PCT/CN2011/083970, mailed Mar. 8, 2012.

*Primary Examiner* — Colleen Dunn

(57) ABSTRACT

A self-shield open magnetic resonance imaging superconducting magnet comprises five pairs of coils: shim coils, first main magnetic coils, second main magnetic coils, third main magnetic coils, and shielding coils. The five pairs of coils are symmetric about the center. The shim coils are arranged closest to the center point; the first main magnetic coils, the second main magnetic coils, the third main magnetic coils, and the shielding coils are arranged in sequence outside. The first main magnetic coils are connected with reverse current. The second and third main magnetic coils are connected with positive current for providing the main magnetic field strength. The shim coils are connected with positive current for compensating the magnetic field in the central region. The shielding coils are connected with reverse current for creating a magnetic field opposite to the main magnetic field for compensating the stray magnetic field in the space.

5 Claims, 2 Drawing Sheets

SELF-SHIELD OPEN MAGNETIC RESONANCE IMAGING SUPERCONDUCTING MAGNET

CROSS-REFERENCE TO RELATED APPLICATIONS

This application claims priority under 35 U.S.C. §371 to, and is a U.S. national phase application of, International Application No. PCT/CN2011/083970, filed Dec. 14, 2011, entitled "SELF-SHIELD OPEN MAGNETIC RESONANCE IMAGING SUPERCONDUCTING MAGNET," which claims priority to Chinese Application No. 201110158077.8, filed Jun. 14, 2011, the disclosures of each is incorporated herein by reference in their entirety.

FIELD OF THE INVENTION

The present invention relates to a superconducting magnet used in the magnetic resonance imaging (MRI) field, and more particularly to an open superconducting magnet.

TECHNICAL BACKGROUND

MRI magnets for whole-body imaging require to achieve high homogeneous magnetic field in a large space, such as a magnetic field non-homogeneity less than 10 ppm (parts per million) in a range of 40 cm diameter spherical volume (DSV). Generally, magnet structures are in form of tunnel, and can provide high field and high homogeneity, as is the case with most of the present magnet structures. However, magnet structures in form of tunnel have unsatisfied openness, and may cause cabin fever for some patients. Although many new structural magnet systems have emerged in recent years, such as a short cavity magnet structure with magnet lengths from 1.3 m to 1.4 m, it is still difficult to meet the need for openness in interventional therapy.

From the point of the development of interventional therapy and medical diagnosis technology, there is a need for fully-open magnet systems to accommodate the need in medical interventional therapy. Current fully-open MRI products focus on permanent magnets, which may provide central magnetic field below 0.7 T, and generally adopt "C" shape structures. WO/2007/094844 provides an open MRI permanent magnet structure, which may have a central magnetic field of up to 1 T. WO/1998/007362 provides a double-side structure MRI permanent magnet. Chinese patent 02210965 provides a two-column C type open magnetic resonance permanent magnet.

A few companies have also developed open magnetic resonance superconducting magnets with field intensities generally below 1.2 T, such as related products that are available from Hitachi Company and Philips Company. China patent 02824552 by Philips Company provides an open magnet structure with a pair of superconducting coils. At present, there are no 1.5 T fully-open MRI systems available in the world.

The main difficulty in open MRI magnets with superconducting coils lies in high cost and difficulties in fabrication technology. For open superconducting magnet structures with passive shield, the magnet system will become too big due to the incorporation of ferromagnetic shield. Moreover, open magnets with active shield have larger ratios of maximum magnetic field to central magnetic field. For example, in the case of a 1.5 T central magnetic field, the maximum magnetic field within the coils may even exceed 10 T, which is not acceptable for superconducting coils adopting NbTi as their material. Thus, there is a need to invent a new magnet structure to overcome this problem.

SUMMARY OF THE INVENTION

This invention provides an open superconducting magnet to overcome the inadequate openness of existing magnetic resonance superconducting magnet systems. The open superconducting magnet structure of this invention may achieve a larger open space, and thus is suitable for use in medical diagnosis and interventional therapy.

The superconducting magnet of this invention comprises five pairs of coils which are arranged to be symmetric about the center. The five pairs of coils comprise shim coils, first main magnetic coils, second main magnetic coils, third main magnetic coils and shielding coils. The shim coils are arranged closest to the central point, and the first main magnetic coils, the second main magnetic coils and the third main magnetic coils are arranged in sequence outward, and the shielding coils are arranged in the outermost layer.

The first main magnetic coils are fed with a reverse current, and the second main magnetic coils and the third main magnetic coils are fed with a positive current to provide a main magnetic field intensity. The shim coils are fed with a positive current to compensate the magnetic field in the central region, so as to improve magnetic field homogeneity of the magnet in a diameter spherical volume (DSV). The shielding coils are fed with a reverse current to generate a magnetic field reverse to the main magnetic field, so as to compensate stray magnetic field in space, making a 5G line of the obtained magnet smaller.

The magnet of this invention may be implemented by low temperature or high temperature superconducting wires, and has the following performance characteristics:

(1) Non-homogeneity is 5 ppm within a 360 mm DSV, which is capable of satisfying the requirements of whole-body imaging;

(2) A maximum magnetic field is less than 9.5 T in the case of 1.5 T central magnetic field, which is less than the critical magnetic field of the NbTi superconducting material (the critical magnetic field of NbTi is about 10 T, 4.2 K). In the situation of increasing axial distances between the shielding coils and the main coils, the maximum magnetic field may be further reduced.

(3) In the case of a 1.5 T central magnetic field, a 5-Gauss stray field is distributed in a range of an ellipsoid domain less than 5 m in the radial direction and about 4.8 m in the axial direction, and thus there is a better electromagnetic compatibility.

(4) The whole magnet structure is compact, and there is provided a clear space larger than 0.6 m between coil planes, without restrictions on fat patients in shape. The maximum coil diameter is less than 1.68 m, and thus the magnet has a lower requirement for floor space.

DESCRIPTION OF THE EMBODIMENTS

This invention will be further described in combination with accompany drawings and specific embodiments.

Figure 1:
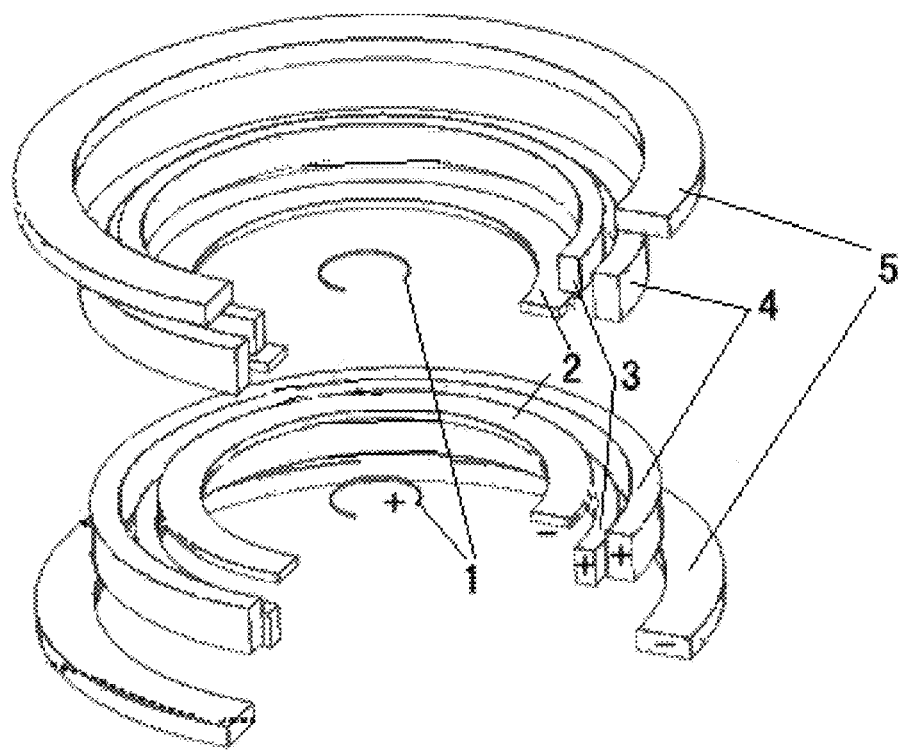
FIG. 1 is the electromagnetic structure of open high homogeneity superconducting coils, 1 for shim coils, 2 for first main field coils, 3 for second main field coils, 4 for third main field coils, 5 for shielding coils.

The structure of the open magnetic resonance magnet of this invention is shown in FIG. 1. This invention comprises five pairs of coils which are symmetric about the center, comprising shim coils 1, first main magnetic field coils 2, second main magnetic field coils 3, third main magnetic field coils 4 and shielding coils 5. The shim coils 1 are arranged closest to the central point, and the first main magnetic field coils 2, the second main magnetic field coils 3 and the third main magnetic field coils 4 are arranged in sequence outward, and the shielding coils 5 are arranged outermost. A main magnetic field is provided by the first main magnetic field coils 2, the second main magnetic field coils 3, and the third main magnetic field coils 4 together. The shim coils 13 compensate the magnetic field in the central region to improve magnetic field homogeneity of the magnet in a spherical domain. The shielding coils 5 generate a magnetic field reverse to the main magnetic field to compensate stray magnetic field in space, so as to make a 5G line of the obtained magnet smaller. The distance between the first main magnetic field coils 2 is minimal, which is 0.6 m; the shielding coils 5 have the largest diameter, which is 1.68 m; therefore, this magnet has a compact coil structure.

Figure 2:
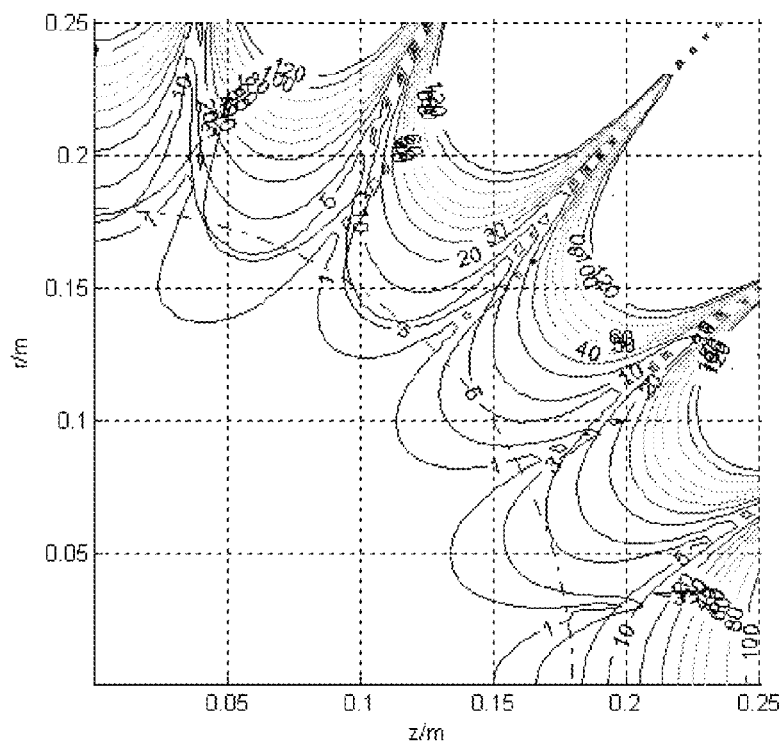
FIG. 2 is a magnetic field homogeneity equipotential line distribution of a DSV with a diameter of 360 mm.

FIG. 2 is the magnetic field homogeneity calculation result of a DSV with a diameter of 360 mm in the magnet system. Non-homogeneity at the edge of the region is about 5 ppm, indicating that the magnet system is capable of providing an appropriate homogeneous magnetic field for use in medical MRI.

Figure 3:
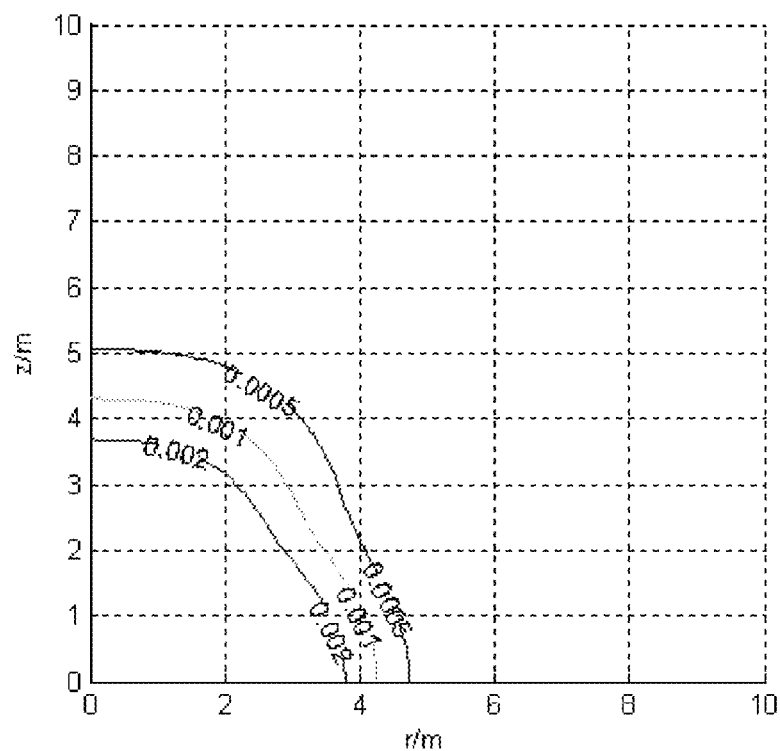
FIG. 3 is a distribution diagram of a 5G line of the magnet system in the case of a 1.5 T central magnetic field.

FIG. 3 is the distribution feature of a 5G line of the magnet system. In a case of a 1.5 T central magnetic field, a 5 Gauss stray field is distributed in a range of an ellipsoid domain less than 5 m in the radical direction and about 4.8 m in the axial direction.

Figure 4:
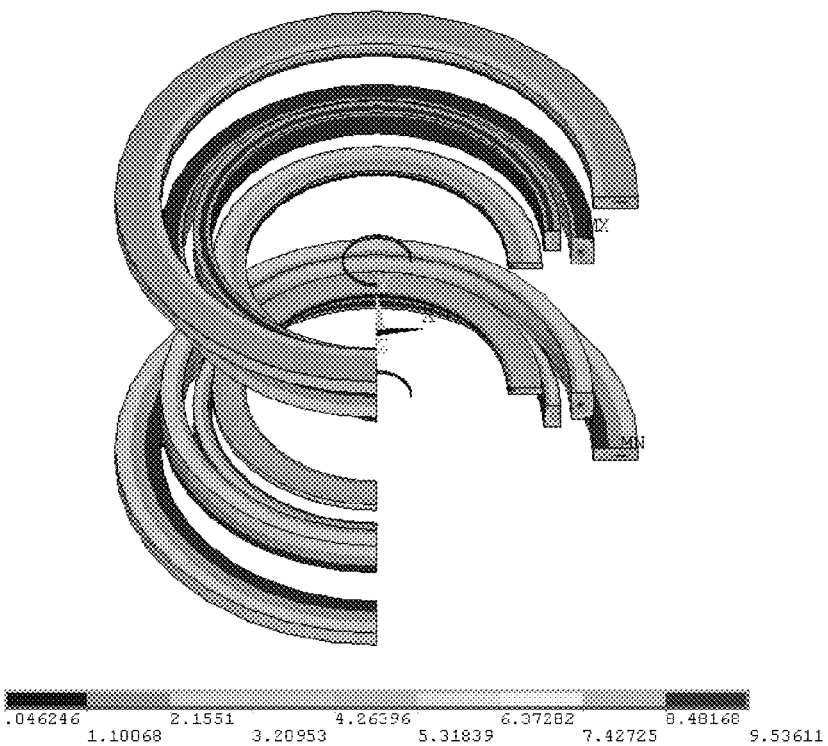
FIG. 4 is a magnetic field distribution over the superconducting coils in the case of a 1.5 T central magnetic field.

FIG. 4 is magnetic field distribution over the superconducting coils, by which performances of superconducting wires adopted for various coils may be determined. In a case of a 1.5 T central magnetic field, the maximum magnetic field is 9.35 T, and the maximum magnetic field is located on the exterior surfaces of coils of the third main magnetic field coils 4. These coils may be implemented by a NbTi Wire-in-Channel conductor (WIC).

What is claimed is:

1. An open magnetic resonance imaging superconducting magnet, characterized in that the superconducting magnet comprises five pairs of coils which are symmetric about a center; the five pairs of coils comprise shim coils, first main magnetic coils, second main magnetic coils, third main magnetic coils and shielding coils; the shim coils are arranged closest to the central point, and the first main magnetic coils, the second main magnetic coils and the third main magnetic coils are arranged in sequence outward, and the shielding coils are arranged in the outermost layer; the first main magnetic coils are fed with a reverse current, and the second main magnetic coils and the third main magnetic coils are fed with a positive current to provide a main magnetic field intensity; the shim magnetic coils are fed with a positive current to compensate the magnetic field in the central region, so as to improve magnetic field homogeneity of the magnet in a spherical region; the shielding coils are fed with a reverse current to generate a magnetic field reverse to the main magnetic field, so as to compensate stray magnetic field in space.

2. The open magnetic resonance imaging superconducting magnet according to claim 1, wherein the distance between the first main magnetic field coils is minimal, which is 0.6 m.

3. The open magnetic resonance imaging superconducting magnet according to claim 1, wherein the shielding coils have the largest diameter, which is 1.68 m.

4. The open magnetic resonance imaging superconducting magnet according to claim 1, wherein the third main magnetic coils are implemented by a NbTi Wire-in-Channel conductor.

5. The open magnetic resonance imaging superconducting magnet according to claim 1, wherein the magnet is implemented by low temperature or high temperature superconducting wires.

* * * * *